(12) United States Patent
Vincent et al.

(10) Patent No.: US 9,502,363 B2
(45) Date of Patent: Nov. 22, 2016

(54) WAFER LEVEL PACKAGES AND METHODS FOR PRODUCING WAFER LEVEL PACKAGES HAVING DELAMINATION-RESISTANT REDISTRIBUTION LAYERS

(71) Applicants: Michael B. Vincent, Chandler, AZ (US); Trung Q. Duong, Austin, TX (US); Zhiwei Gong, Chandler, AZ (US); Scott M. Hayes, Chandler, AZ (US); Alan J. Magnus, Gilbert, AZ (US); Douglas G. Mitchell, Tempe, AZ (US); Eduard J. Pabst, Mesa, AZ (US); Jason R. Wright, Chandler, AZ (US); Weng F. Yap, Chandler, AZ (US)

(72) Inventors: Michael B. Vincent, Chandler, AZ (US); Trung Q. Duong, Austin, TX (US); Zhiwei Gong, Chandler, AZ (US); Scott M. Hayes, Chandler, AZ (US); Alan J. Magnus, Gilbert, AZ (US); Douglas G. Mitchell, Tempe, AZ (US); Eduard J. Pabst, Mesa, AZ (US); Jason R. Wright, Chandler, AZ (US); Weng F. Yap, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/223,805

(22) Filed: Mar. 24, 2014

(65) Prior Publication Data
US 2015/0270233 A1 Sep. 24, 2015

(51) Int. Cl.
*H01L 23/00* (2006.01)
*H01L 21/56* (2006.01)
*H01L 23/31* (2006.01)

(52) U.S. Cl.
CPC ............ *H01L 24/02* (2013.01); *H01L 21/561* (2013.01); *H01L 24/19* (2013.01); *H01L 23/3128* (2013.01); *H01L 23/564* (2013.01); *H01L 24/96* (2013.01); *H01L 2224/02375* (2013.01); *H01L 2224/02379* (2013.01); *H01L 2224/02381* (2013.01); *H01L 2224/04105* (2013.01); *H01L 2224/12105* (2013.01); *H01L 2224/13022* (2013.01); *H01L 2224/16227* (2013.01); *H01L 2224/96* (2013.01); *H01L 2924/12042* (2013.01); *H01L 2924/181* (2013.01)

(58) Field of Classification Search
CPC ....... H01L 24/02; H01L 24/19; H01L 24/94; H01L 21/561; H01L 2224/0231; H01L 2224/02373
See application file for complete search history.

(56) References Cited

U.S. PATENT DOCUMENTS

| | | | |
|---|---|---|---|
| 6,613,413 B1 | 9/2003 | Japp et al. | |
| 6,944,946 B2 * | 9/2005 | Japp et al. | 29/852 |
| 7,055,119 B2 | 5/2006 | Bartley et al. | |
| 2013/0075144 A1 | 3/2013 | Park et al. | |
| 2013/0320530 A1 * | 12/2013 | Koey et al. | 257/738 |

* cited by examiner

*Primary Examiner* — Laura Menz
*Assistant Examiner* — Candice Y Chan (57) ABSTRACT

Wafer level packages and methods for producing wafer level packages having delamination-resistant redistribution layers are provided. In one embodiment, the method includes building inner redistribution layers over a semiconductor die. Inner redistribution layers include a body of dielectric material containing metal routing features. A routing-free dielectric block is formed in the body of dielectric material and is uninterrupted by the metal routing features. An outer redistribution layer is produced over the inner redistribution layers and contains a metal plane, which is patterned to include one or more outgassing openings overlying the routing-free dielectric block. The routing-free dielectric block has a minimum width, length, and depth each at least twice the thickness of the outer redistribution layer.

16 Claims, 6 Drawing Sheets

WAFER LEVEL PACKAGES AND METHODS FOR PRODUCING WAFER LEVEL PACKAGES HAVING DELAMINATION-RESISTANT REDISTRIBUTION LAYERS

TECHNICAL FIELD

Embodiments of the present invention relate generally to microelectronic packaging and, more particularly, to wafer level packages and methods for producing wafer level packages having delamination-resistant redistribution layers.

BACKGROUND

Wafer level packaging processes can be broadly divided into two categories: Fan-In Wafer Level Packaging and Fan-Out Wafer Level Packaging processes. Fan-In Wafer Level Packaging processes enable the production of Fan-In Wafer Level Packages (FI-WLPs) containing one or more non-encapsulated die. Fan-In Wafer Level Packaging processes can be performed entirely on the wafer level, while producing FI-WLPs having planform dimensions equal to or nearly equal to the size of die (also commonly referred to as "Chip Scale Packages"). Electrical interconnection between the packaged die and the external contact array can be provided by a leadframe, an interposer, or a number of redistribution layers, depending upon the particular packaging approach employed. By comparison, Fan-Out Wafer Level Packaging processes allow the production of larger Fan-Out Wafer Level Packages (FO-WLPs) having peripheral fan-out areas, which enlarge the surface area of the package topside over which a contact array can be formed. In an example of one known FO-WLP packaging approach, an array of singulated die is encapsulated in a molded panel over which one or more redistribution layers and a Ball Grid Array (BGA) are produced. After formation of the redistribution layers and the BGA, the panel is singulated to yield a number of microelectronic packages each containing a semiconductor die embedded within a molded body. Relative to CSP packages, FO-WLPs typically provide an increased I/O pin count and superior mechanical protection of the packaged die.

Delamination can occur within the redistribution layers under certain circumstances. For example, and without implicit concession that such a problem has been recognized in the art, redistribution layer delamination may occur when water contained with the redistribution layers vaporizes during package heating. Delamination can result in package failure or may otherwise negatively impact the performance of the Wafer-Level Package (WLP). It is thus desirable to provide WLPs and methods for fabricating WLPs wherein the likelihood of redistribution layer delamination is reduced or eliminated. Other desirable features and characteristics of the present invention will become apparent from the subsequent Detailed Description and the appended Claims, taken in conjunction with the accompanying Drawings and the foregoing Background.

BRIEF DESCRIPTION OF THE DRAWINGS

At least one example of the present invention will hereinafter be described in conjunction with the following figures, wherein like numerals denote like elements, and.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following describes WLPs and methods for producing WLPs having redistribution layers, which are resistant to delamination during package heating and which contain one or more routing-free dielectric blocks of the type described below. In certain embodiments, the below-described "capping effect" is avoided by producing the metal planes (e.g., ground and/or power planes) overlying the routing-free dielectric blocks located within the redistribution layers to include outgassing openings, which permit the rapid outflow of water vapor from the dielectric blocks during package heating. In such embodiments, one or more relatively large outgassing openings can be selectively formed in the metal planes at locations overlying each of the routing-free dielectric blocks. Alternatively, the metal planes can be imparted with mesh regions overlying the routing-free dielectric blocks and having multiple perforations or voids allowing the rapid outgassing of water vapor. In addition to or in lieu of patterning the metal planes overlying the dielectric blocks to include outgassing openings, metal fill features can be formed within the routing-free dielectric blocks to reduce the dielectric content thereof. This, in turn, reduces the moisture-absorbing capacity of the dielectric blocks and, therefore, the quantity of moisture available for vaporization during package heating. As a result, the internal pressure within the dielectric blocks is maintained at a sufficiently reduced level during package heating to minimize the likelihood of delamination within the redistribution layers even when the dielectric blocks are capped by solid, continuous, or unbroken metal planes.

As noted in the foregoing section entitled "BACKGROUND," WLPs are commonly built to include a number of redistribution layers overlying one or more packaged die. The redistribution layers include, in turn, one or more metal layers or levels, which are patterned to define electrically-conductive routing features making-up the wiring structure of the package. The routing features can include a combination of interconnect lines, metal plugs, and metal planes, which collectively provide electrical communication between the packaged semiconductor die and, for example, a BGA or other contact array accessible from the exterior of the package. The patterned metal levels are interspersed with layers of a dielectric material, which can be deposited by spin-on application of a dielectric polymer or other dielectric material (referred to herein as the "RDL dielectric material"). It is not uncommon for a WLP having a relatively high wiring density to include three or more redistribution layers. Additionally, in certain cases, the redistribution layers can contain one or more relatively large regions that are uninterrupted by routing features. Such regions are referred to herein as "routing-free dielectric blocks" and have a minimum width, length, and depth at least twice the RDL dielectric layer thickness. The routing-free dielectric blocks are thus necessarily formed in at least two overlying redistribution layers and will often have a depth spanning two or more redistribution layers, as discussed more fully below.

The routing-free dielectric blocks can be composed entirety or substantially entirely of an RDL dielectric material having a tendency to absorb water from the surrounding atmosphere. The routing-free dielectric blocks can thus contain relatively large quantities of moisture, which vaporizes when the WLP is heated to temperatures surpassing the boiling point of water. Heating of the WLP can occur during initial package fabrication (e.g., during a ball attach process utilized to produce any BGAs that can be included within the package) and/or after package fabrication (e.g., during board level assembly of the package). In instances wherein the heating schedule entails a relatively rapid thermal ramp-up, the pressure within the redistribution layers can become highly elevated if the water vapor should become entrapped within the routing-free dielectric blocks. Entrapment of the water vapor can occur when water-impermeable barriers prevent outgassing of the water vapor through the package topside and/or through the package bottomside. This can be particularly problematic when the routing-free dielectric blocks are formed over packaged semiconductor die and under a solid or continuous metal plane, such as ground or power plane. In this case, the semiconductor die and metal plane can prevent or at least impede water vapor outgassing through the package bottomside and topside, which eliminates outgassing paths permitting the bulk outflow of water vapor during package heating. A "capping" effect can consequently result wherein the water vapor becomes trapped within the routing-free dielectric blocks during package heating. The pressure within and around the routing-free dielectric blocks thus becomes highly elevated during package heating, and redistribution layer delamination can occur. Redistribution layer delamination can result in package failure or can otherwise negatively impact the performance of the WLP. An example of such a "capping" effect is further illustrated and described below in conjunction with FIG. 1.

Figure 1:
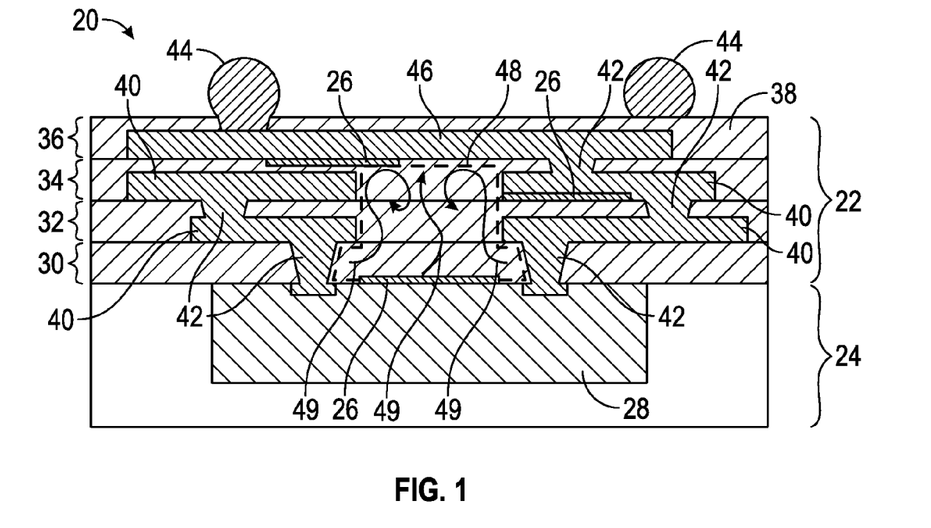
FIG. 1 is cross-sectional views of an exemplary FO-WLP having a number of redistribution layers, which may be prone to delamination during package heating due to, for example, the vaporization of moisture contained within the RDL dielectric material.

FIG. 1 illustrates, in simplified cross-section, a FO-WLP 20 including a number of redistribution layers 22, which have been built-up over the frontside of a molded package body 24 containing an embedded semiconductor die 28. In this example, redistribution layers 22 include first, second, third, and fourth layers 30, 32, 34, and 36. Redistribution layers 30, 32, and 34 are also referred herein to as the "inner" redistribution layers in view of their relative proximity to die 28, while redistribution layer 36 are referred to herein as an "outer" redistribution layer. As shown in FIG. 1, redistribution layer 36 can be produced as the outermost or last redistribution layer; however, in further embodiments, additional redistribution layers can be produced above outer redistribution layer 36. Redistribution layers 22 further include a body of dielectric material 38 containing a network of interconnect lines 40. Interconnect lines 40 are produced by patterning successively-deposited metal layers or levels contained within dielectric body 38, which can similarly be produced by depositing dielectric layers interspersed with the metal levels. Metal plugs 42 are further formed in redistribution layers 22 to electrically couple interconnect lines in overlying metal levels. Collectively, interconnect lines 40 and metal plugs 42 provide electrical communication between die 28 and an externally-accessible BGA 44 formed over the topside of package 20. As further shown in FIG. 1, the outermost metal level (the "$M_3$" metal level) within outer redistribution layer 36 is patterned to include a solid metal plane 46, such as a ground or power plane.

In addition to the above-described routing features (i.e., interconnect lines 40, metal plugs 42, and solid metal plane 46), redistribution layers 22 are produced to include one or more routing-free dielectric blocks into which the routing features do not extend. Dashed line 48 shown in FIG. 1 generally demarcates the outer boundaries of one such routing-free dielectric block 48. The minimum width, length, and depth of dielectric block 48 are each equal to or greater than twice the thickness of any given layer included within redistribution layers 22, including outer redistribution layer 36. Thus, in embodiments wherein the thickness of redistribution layer 36 is between about 20 and about 30 microns (m), the minimum width, length, and depth of the routing-free dielectric blocks can be between about 40 and about 60 μm; the term "about," as appearing herein, denoting a disparity of less than 10%. In FIG. 1, routing-free dielectric block 48 is formed in and has a depth spanning inner redistribution layers 30, 32, and 34. As interconnect lines 40 do not extend into dielectric block 48, routing-free dielectric block 48 can be composed entirely or substantially entirely of the RDL dielectric material. As noted above, the RDL dielectric material can have a high moisture content due to, for example, a tendency to absorb moisture from the surrounding atmosphere. Consequently, routing-free dielectric block 48 can also contain a relatively large volume of moisture.

Routing-free dielectric block 48 is located over semiconductor die 28 and underlies solid metal plane 46. Solid metal plane 46 thus covers or caps routing-free dielectric block 48 and prevent or impede the outgassing of water vapor from dielectric block 48 through the package topside during package heating. At the same time, semiconductor die 28 can prevent or impede the escape of water vapor from dielectric block 48 directly through the package bottomside during package heating. The above-described "capping" effect can thus occur during package heating wherein water vapor becomes trapped within routing-free dielectric block 48 (represented in FIG. 1 by arrows 49), the pressure within and around dielectric block 48 becomes highly elevated, and delamination can occur within redistribution layers 22. In the event of delamination, separation will typically occur at the RDL dielectric interfaces, such as the boundaries between the RDL dielectric material and metal capping plane 46, at the boundaries between the dielectric material and interconnect lines 40 proximate block 48, and/or at the boundaries between the dielectric material and the embedded die 28. The regions of redistribution layers 22 prone to separation are represented by lines 26 in FIG. 1. It has been observed that redistribution layer delamination is especially problematic when the routing free dielectric blocks have a depth spanning at least three redistribution layers and, thus, contain a relatively large amount of moisture.

In accordance with certain embodiments of the present invention, the above-described "capping effect" is avoided by producing the metal planes (e.g., ground and/or power planes) overlying the routing-free dielectric blocks located within the redistribution layers to include outgassing openings, which permit the rapid outflow of water vapor from the dielectric blocks during package heating. Examples of WLPs having metal planes overlying routing-free dielectric blocks and patterned to include outgassing openings are described below in conjunction with FIGS. 4-9. In addition to or in lieu of patterning the metal planes overlying the dielectric blocks to include outgassing openings, metal fill features can be formed within the routing-free dielectric blocks to reduce the dielectric content thereof. This, in turn, reduces the moisture-absorbing capacity of the dielectric blocks and, therefore, the quantity of moisture available for vaporization during package heating. As a result, the internal pressure within the dielectric blocks is maintained at a sufficiently reduced level during package heating to minimize the likelihood of delamination within the redistribution layers even when the dielectric blocks are capped by solid, continuous, or unbroken metal planes. Examples of wafer level packages including routing-free dielectric blocks containing metal fill features are further described below in conjunction with FIGS. 10 and 11.

Embodiments of the fabrication methods described herein can be utilized to produce both FI-WLPs and FO-WLPs. In embodiments of the fabrication method utilized to produce FI-WLPs, such as CSP packages, a non-singulated semiconductor wafer can be processed in the manner described below (e.g., via the build-up of multiple redistribution layers thereover) and subsequently singulated to yield a number of completed FI-WLPs having delamination-resistant redistribution layers. During build-up of the redistribution layers, the routing-free dielectric blocks within the redistribution layers can be produced to include metal fill features and/or any metal plane or planes formed above the dielectric blocks can be patterned to include outgassing openings in the below-described manner. By comparison, in embodiments of the fabrication method utilized to produce FO-WLPs, processing can be carried-out utilizing a molded panel in which an array of singulated semiconductor die has been embedded. In this latter case, other types of microelectronic devices (e.g., passive components, such as discrete inductors, resistors, capacitors, and the like) can be embedded within the molded panel along with the semiconductor die to, for example, produce System-in-Package (SiP) FO-WLPs. redistribution layers are then sequentially built-up over the molded panel in the below-described manner, which is subsequently singulated to yield a number of completed FO-WLPs. An example of one manner in which a molded panel containing a number of semiconductor die and useful in the production of FO-WLPs having delamination-resistant redistribution layers will now be described in conjunction with FIGS. 2 and 3.

Figure 2:
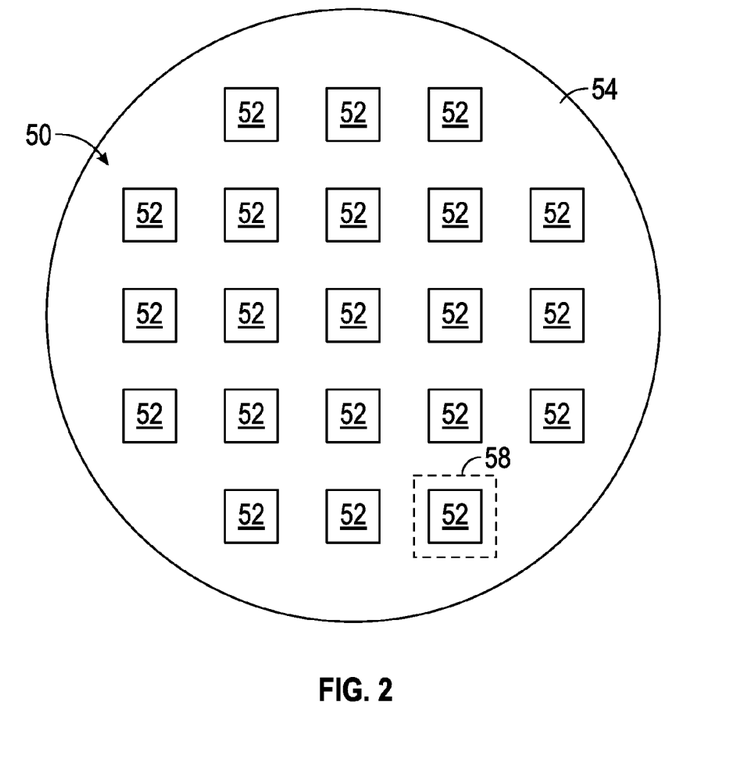
FIG. 2 is a top-down view of an exemplary molded panel in which a plurality of semiconductor die has been embedded and which undergo further processing to produce a number of FO-WLPs having delamination-resistant redistribution layers in accordance with embodiments of the present invention.

FIG. 2 illustrates a top-down or planform view of a molded panel 50 containing a number of semiconductor die 52, which can be processed in the below-described manner to produce a number of FO-WLPs having delamination-resistant redistribution layers. For the purposes of explanation, molded panel 50 is shown as containing a relatively small array of microelectronic devices consisting only of substantially identical semiconductor die 52. This example notwithstanding, it will be appreciated that the semiconductor die embedded within molded panel 50 need not be identical and can vary in shape, dimensions, and/or layout in further embodiments. If desired, various other types of microelectronic devices, such as passive or discrete microelectronic components, can be embedded within molded panel 50 along with semiconductor die 52 in further embodiments. Molded panel 50 includes a panel body having a major surface 54 (referred to herein as "frontside surface 54") through which the respective frontsides of semiconductor die 52 are exposed. At this juncture in the fabrication process, semiconductor die 52 have undergone wafer level processing and each carry one or more integrated circuits. Bond pads (e.g., bond pads 64 shown in FIGS. 3-5, 8, 10, and 11) are disposed on the frontsides of die 52 to provide points-of-contact to the circuits carried thereby. As explained below, a number of redistribution layers are subsequently built-up over the frontside of molded panel 50 and contain electrically-conductive interconnect lines, which are formed in ohmic contact with the bond pads of the embedded die 52.

By way of non-limiting example, one process suitable for producing molded panel 50 is performed as follows. First, semiconductor die 52 are distributed in a desired spatial arrangement over the upper surface of a temporary substrate, such as a layer of adhesive tape. If desired, one more release layers can also be applied or otherwise formed over the carrier's supper surface prior to positioning of the die. A mold frame, which has a central cavity or opening therethrough, is positioned over the temporary substrate and around the array of semiconductor die 52 utilizing a pick-and-place tool. A dielectric mold compound or encapsulant, such as a silica-filled epoxy, is then dispensed into the cavity of the mold frame and flows over semiconductor die 52. Sufficient volume of the encapsulant is typically dispensed over semiconductor die 52 to enable the encapsulant to flow over the backsides or non-contact-bearing surfaces of die 52. The encapsulant can then be solidified by, for example, an oven cure to yield a solid panel body in which semiconductor die 52 are embedded. Molded panel 50 can be produced as a relatively thin body or mass having any desired dimensions and planform shape, such as a circular or rectangular shape. The panel body can be rigid or flexible, depending upon the chosen encapsulant. The panel body is then released from the temporary substrate to reveal the frontside 54 of panel 50 through which die 52 are exposed. If desired, the backside of the panel body can be ground or polished to bring molded panel 50 to a desired thickness prior to release of the panel body from the carrier. In further embodiments, a ground plane is also formed and encapsulated in the molded panel. The foregoing example notwithstanding, molded panel 50 can be produced utilizing other known fabrication techniques in further embodiments including, but not limited to, compression molding and lamination processes.

Figure 3:
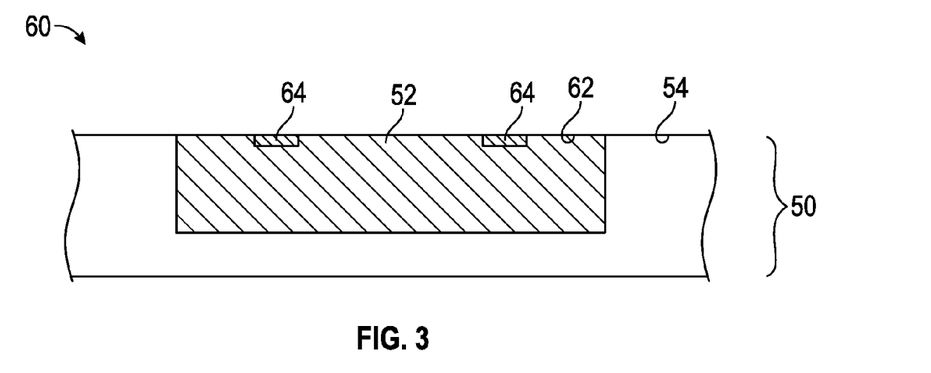
FIG. 3 is a cross-sectional view of a portion of the molded panel shown in FIG. 2 containing at least one semiconductor die, which is included in the exemplary FO-WLPs shown in FIGS. 4, 5, 8, 10, and 11.
Figure 4:
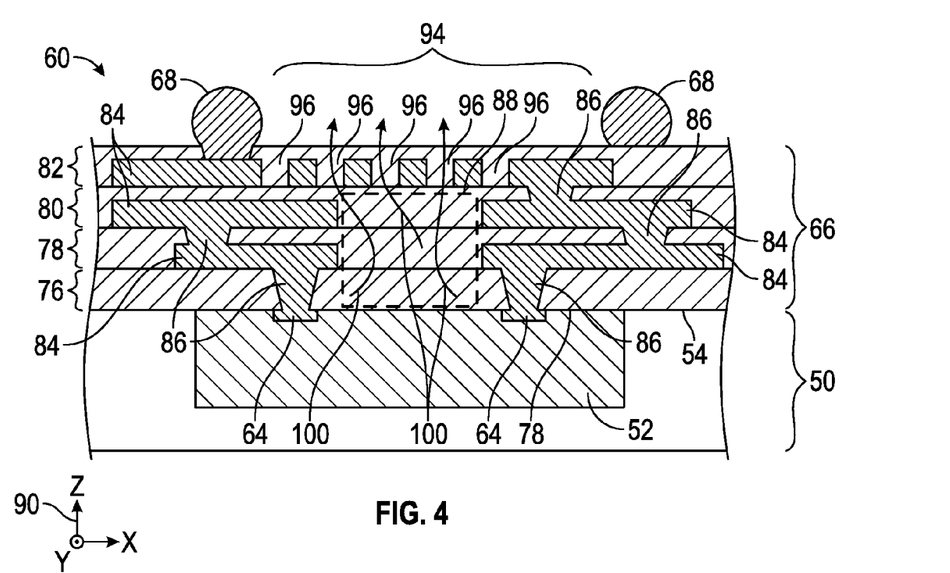
FIGS. 4 and 5 are cross-sectional views illustrating a FO-WLP in partially completed and fully completed states, respectively, and including a mesh metal plane overlying one or more routing-free dielectric blocks located within the redistribution layers, as illustrated in accordance with a further exemplary embodiment of the present invention.

A number of redistribution layers are next produced over frontside 54 of molded panel 50 and the semiconductor die 52 embedded therein. FIGS. 3 and 4 are cross-sectional views taken through a portion of the molded panel 50 containing a single semiconductor die 52 (generally demarcated in FIG. 2 by dashed box 58), which illustrate one manner in which a number of redistribution layers 66 (identified in FIG. 4) can be produced over molded panel 50. Hereafter, the following description and the accompanying figures will focus primarily on the processing of the portion of molded panel 50 shown in FIG. 3 and the production of a single FO-WLP. The FO-WLP is identified by reference numeral "60" and is shown in a partially-completed state in FIGS. 3 and 4. FO-WLP 60 is also illustrated in a completed state in FIG. 5, as further described below. While the following description focuses on the processing of the region of molded panel 50 from which FO-WLP 60 is produced, it will be understood that the below-described process steps will typically be performed globally across molded panel 50 and for all die 52 to simultaneously produce a plurality of completed FO-WLPs in conjunction with package 60 with each package containing one or more of semiconductor die 52 shown in FIG. 2.

With initial reference to FIG. 3, FO-WLP 60 is shown prior to build-up of the redistribution layers. As can be seen, semiconductor die 52 includes a frontside 62 over which a plurality of bond pads 64 are disposed (only two of which are visible in FIG. 3). The frontside of die 52 and, therefore, bond pads 64 are exposed through frontside 54 of molded panel 50. By comparison, FIG. 4 illustrates partially-completed FO-WLP 60 and, more generally, molded panel 50 after a number of redistribution layers 66 have been built thereover. In the illustrated example, redistribution layers 66 include four layers, namely, redistribution layers 76, 78, 80, and 82. In further embodiments, FO-WLP 60 can include fewer or a greater number of redistribution layers. Redistribution layers 76, 78, and 80 are also referred to as the "inner" redistribution layers herein in view of the relatively close proximity to die 52 and molded panel 52; while redistribution layer 82 are also referred to as an "outer" redistribution layer. This terminology is utilized only in a comparative sense to indicate that "inner" redistribution layers 76, 78, and 80 are located closer to the packaged die 52 than is one or more "outer" redistribution layers. Thus, it is possible for additional redistribution layers to be formed between inner redistribution layer 76 and panel 50 in further embodiments. Similarly, while outer redistribution layer 82 is the outermost or final redistribution layer in the illustrated example, one or more additional redistribution layers can be produced over outer redistribution layer 82 in further embodiments.

Figure 5:
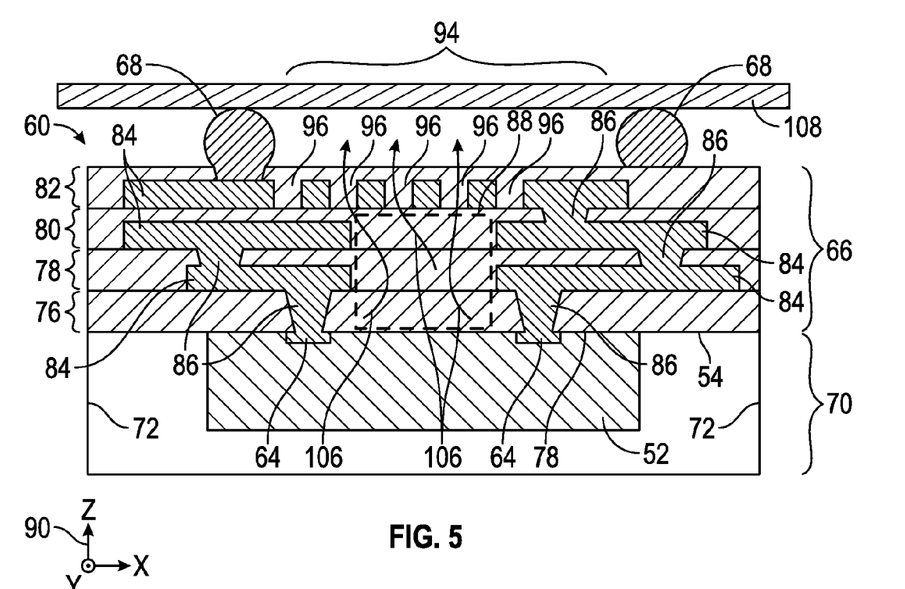

Redistribution layer 76, 78, 80, and 82 each includes at least one dielectric layer, which can be deposited by spin-on application of a dielectric polymer. Additionally, with the exception of the innermost or first redistribution layer 76, RDL dielectric layers 78, 80, and 82 each include a metal level (the "$M_1$," "$M_2$," and "$M_3$" metal levels, respectively). The metal levels are patterned to define electrically-conductive structures including a series of interconnect lines 84, which, along with metal plugs 86, provide electrical communication between semiconductor die 52 and at least one contact array accessible from the exterior of package 60. For example, as shown in FIG. 4, a BGA including a number of solder balls 68 can be produced over the outermost redistribution layer 66 and electrically coupled to bond pads 64 of packaged die 52 via the metal routing features formed in redistribution layers 66. In further embodiments, other types of contact arrays can be produced over the frontside and/or over the backside of package 60. The metal levels can be produced utilizing well-known metal plating and lithographical patterning processes. After build-up of redistribution layers 66 and the formation of BGA 68, molded panel 50 (FIGS. 2 and 3) is singulated to yield a plurality of microelectronic packages including FO-WLP 60. Singulation of molded panel 50 can be performed utilizing a dicing saw, although other singulation techniques can be used, such as laser cutting. The completed FO-WLP 60 is shown in FIG. 5 wherein the singulated piece of molded panel 50 included within package 60 is identified by reference numeral "70" and is referred to herein as the "molded package body." Molded package body 70 has vertical package sidewalls 72 defined by singulation of panel 50 (FIGS. 2 and 3).

As does FO-WLP 20 shown in FIG. 1, FO-WLP 60 includes at least one routing-free dielectric block 88 into which the metal routing features contained within redistribution layers 66 do not extend. Additional routing-free dielectric blocks, which may be similar to dielectric block 88, can be formed in multiple locations across redistribution layers 66, some or all of which can overlie die 52. More generally, and considered prior to singulation of panel 50, routing-free dielectric blocks can be formed at multiple locations across molded panel 50 (FIG. 2) during the above-described redistribution layer build-up process. The particular shape and locations of the routing-free dielectric blocks can vary; however, as previously noted, the routing-free dielectric blocks will each have a length, width, and depth equal to or greater than twice the RDL dielectric layer thickness. With respect to the routing-free dielectric block 88 shown in FIGS. 4 and 5, specifically, dielectric block 88 can have a length, width, and depth each at least twice the thickness of outer redistribution layer 82 (the length, width, and depth of dielectric block 88 taken along the Y-, X-, and Z-axes, respectively identified by coordinate legend 90 in FIGS. 4 and 5). Thus, in embodiments wherein the thickness of redistribution layer 82 is between about 20 and about 30 microns (m), the minimum width, length, and depth of the routing-free dielectric blocks can be between about 40 and about 60 μm. In certain cases, the minimum width, length, and depth of routing-free dielectric block 88 is equal to or greater than 75 μm and, in certain cases, may exceed about 100 μm. In still further embodiments, the minimum width, length, and depth of dielectric block 88 can be greater than or lesser than the aforementioned values. In further embodiments, the planform dimensions (the length and width) of routing-free dielectric block 88 can each exceed about 75 μm, and dielectric block 88 can have a depth spanning at least two overlying dielectric layers. In one embodiment, dielectric block 88 contains less than 10% metal and spans at least three dielectric layers.

Figure 6:
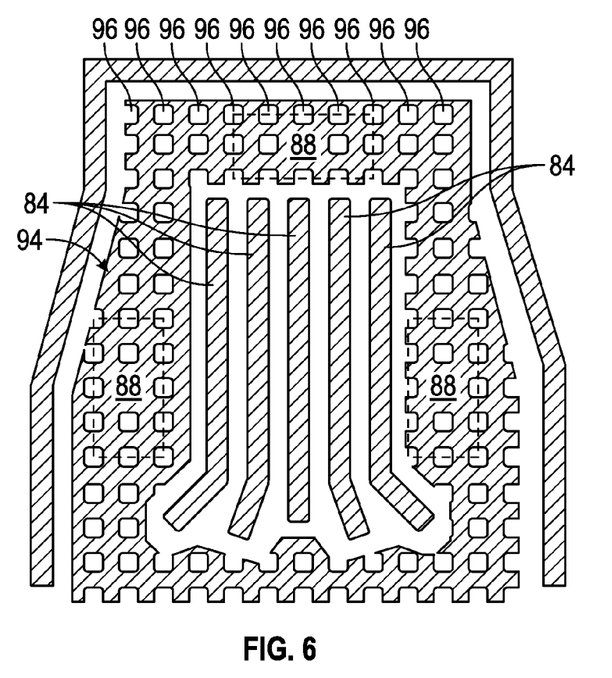
FIG. 6 is a top-down view of the last or outermost metal level included within the FO-WLP shown in FIG. 4, which are patterned to include one or more mesh regions overlying the routing-free-dielectric blocks.

As was the last metal level of FO-WLP 20 shown in FIG. 1, the last or outermost metal level (i.e., M₃ metal level 78 shown in FIGS. 4 and 5) can be patterned to include at least one metal plane 94, such as a ground or power plane (shown more clearly from a top-down perspective in FIG. 6, as described below). However, in contrast to FO-WLP 20 (FIG. 1), metal plane 94 is imparted with at least one mesh region overlying the routing-free dielectric block or blocks located within redistribution layers 66. The mesh region or regions of metal plane 94 overlying the illustrated dielectric block 88 include a number of outgassing openings 96, which permit the rapid outflow of water vapor when FO-WLP 60 is heated to temperature sufficient to induce vaporization of the moisture within dielectric block 88. For example, as indicated in FIG. 4 by arrows 100, outgassing openings 96 can allow the bulk outflow of water vapor from routing-free dielectric block 88 (and the other non-illustrated dielectric blocks within redistribution layers 66) during the ball attach process utilized to produce BGA 68. Additionally or alternatively, outgassing openings 96 allow the outflow of water vapor from dielectric block 88 during board level assembly, such as during mounting of FO-WLP 20 to a Printed Circuit Board (PCB) 108, as indicated in FIG. 5 by arrows 106. Thus, by patterning metal plane 94 to include at least one mesh region having outgassing openings 96 therein, the accumulation of pressure within and around routing-free dielectric block 88 is minimized during package heating, and the likelihood of redistribution layer delamination is significantly reduced or eliminated.

Outgassing openings 96 can have any shape, dimensions, and spatial arrangement suitable for allowing the rapid outflow of water vapor from routing-free dielectric bock 88 in the above-described manner. In certain embodiments, metal plane 94 is produced to include multiple discrete mesh regions, which overlie different routing-free dielectric blocks located within redistribution layers 66 of FO-WLP 60. Alternatively, metal plane 94 can be patterned such that the mesh region is formed across the entirety or substantial entirety of plane 94. This may be appreciated by referring to FIG. 6, which is a top-down or planform view of patterned metal level 78 illustrating metal plane 94 along with a number of M₃ interconnect lines 84. In the illustrated example, metal plane 94 is wholly imparted with a mesh pattern defined by outgassing openings 96 (only some of which are labeled in FIG. 6). Outgassing openings 96 can assume the form of a generally circular or rounded square openings arranged in a grid array. In other embodiments, the mesh region or regions of metal plane 94 can assume other patterns, such as that of a lattice. As indicated in FIG. 6 by dashed rectangles, a number of routing-free dielectric blocks 88 can underlie different regions of mesh metal plane 94, which permit rapid outgassing of water vapor from dielectric blocks 88 during package heating as previously described.

Figure 7:
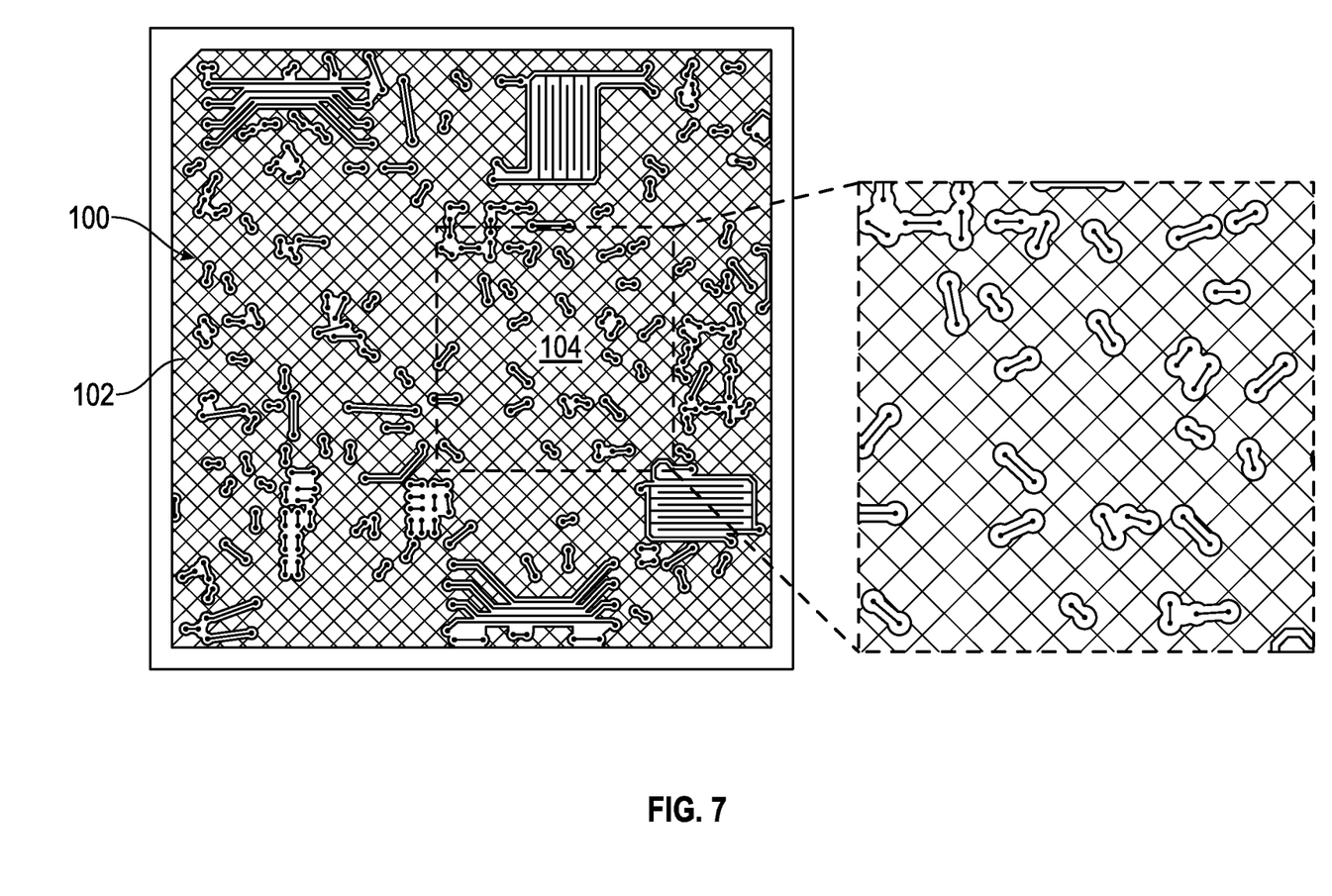
FIG. 7 is a top-down view of a patterned metal level including a mesh metal plane, which can be included within a WLP in accordance with a still further embodiment of the present invention.

It will be appreciated that FIGS. 3-6 are simplified drawings or schematics of FO-WLP 60 and mesh metal plane 94, which are useful for the purpose of explanation. Actual implementations of FO-WLP 60, and thus actual implementations of the metal level or levels patterned to include one or more mesh regions, will typically be more complex. Consider, for example, FIG. 7 illustrating a top-down view of a patterned metal level 100 including a mesh metal plane 102, which can be included within an actual or "real-world" implementation of FO-WLP 60. Additionally, on the right side of FIG. 7, an enlarged region of the patterned metal level 100 corresponding to dashed box 104 is shown to more clearly illustrate the mesh structure of metal plane 102. As can be seen in the more detailed view appearing on the right of FIG. 7, metal plane 102 is produced to have a lattice-like pattern of outgassing openings therein. In further embodiments, the mesh plane or the mesh regions of the metal plane(s) may be produced to have other patterns of openings. In one embodiment, the outgassing openings formed in mesh metal plane 102 can be sufficiently large such that, taken cumulatively, the openings make-up at least about 50% of the surface area of metal plane 102. Similarly, in embodiments wherein only selected regions of a metal plane are imparted with a mesh pattern, the outgassing openings formed in the metal plane can cumulatively constitute at least about 50% of the mesh region surface area.

Figure 8:
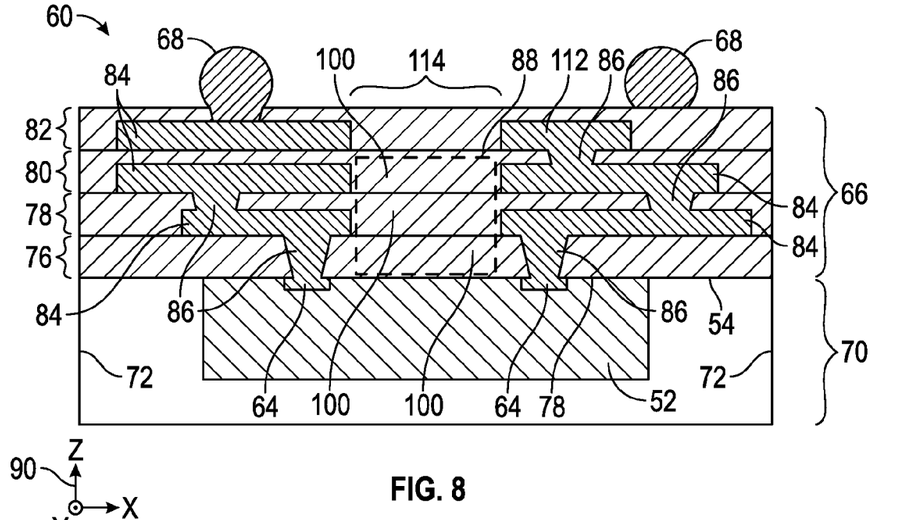
FIG. 8 is a cross-sectional view illustrating a FO-WLP produced to include outgassing openings overlying the routing-free dielectric blocks located within the redistribution layers, as illustrated in accordance with a further exemplary embodiment of the present invention.
Figure 9:
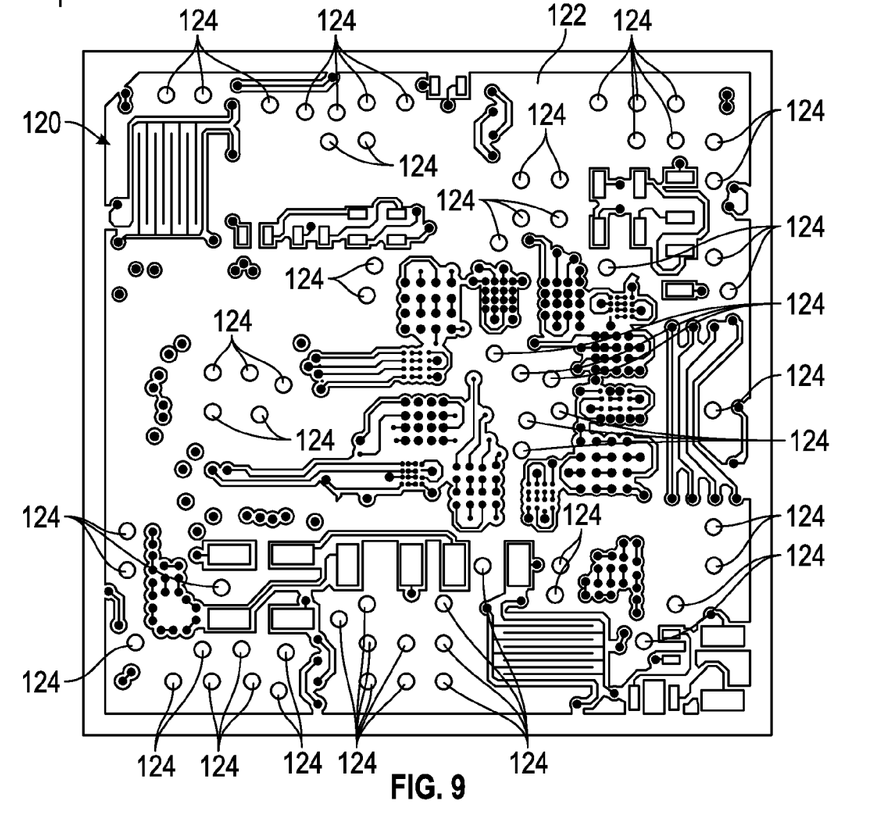
FIG. 9 is a top-down view of a patterned metal level including a metal plane having a number of relatively large outgassing openings formed at selected locations overlying the routing-free dielectric blocks located within the redistribution layers, as illustrated in accordance with a still further exemplary embodiment of the present invention.

In the above-described embodiments, the metal plane or planes overlying the routing-free dielectric blocks are imparted with one or more mesh regions to allow the rapid outgassing of water vapor during package heating. In further embodiments, one or more relatively large outgassing openings can be formed in the metal plane or planes overlying each of the routing-free dielectric blocks located within the redistribution layers. In this regard, FIG. 8 is a cross-section view of a FO-WLP 110 in accordance with a further embodiment of the present invention wherein like reference numerals are utilized to denote like structural elements. As can be seen, FO-WLP 110 includes at least one routing-free dielectric block 88, which overlies packaged die 52 and which underlies a metal plane 112 (e.g., a ground or power plane formed in the outermost metal level). In this case, a single, relatively large outgassing opening 114 is formed in plane 112 over routing-free dielectric block 88. Outgassing opening 114 can have a round, rectangular, or any other regular or irregular planform shape. Outgassing opening 114 is considered "relatively large" in the sense that the planform dimensions of opening 114 (i.e., the length and width of opening 114 as taken along the Y- and X-axes of legend 90, respectively) can be at least one half the planform dimensions of routing-free dielectric block 88 and, perhaps, substantially equivalent to or greater than those of dielectric block 88 (as illustrated for the width of opening 114 taken along the X-axis). For example, in one embodiment, the planform dimensions of outgassing opening 114 can each be greater than 75 µm. A number of outgassing openings similar to opening 114 can be formed at selected located across plane 112 over the routing-free dielectric blocks. Further emphasizing this point, FIG. 9 is a top-down view of patterned metal level 120 including a metal plane 122, which may be considered a "real-world" implementation of plane 112 shown in FIG. 8. As can be seen, metal plane 122 has been patterned to include a number of outgassing openings 124 (analogous to opening 114 shown in FIG. 8) formed at selected locations of plane 122 overlying routing-free dielectric blocks, such as dielectric block 88 shown in FIG. 8.

Figure 10:
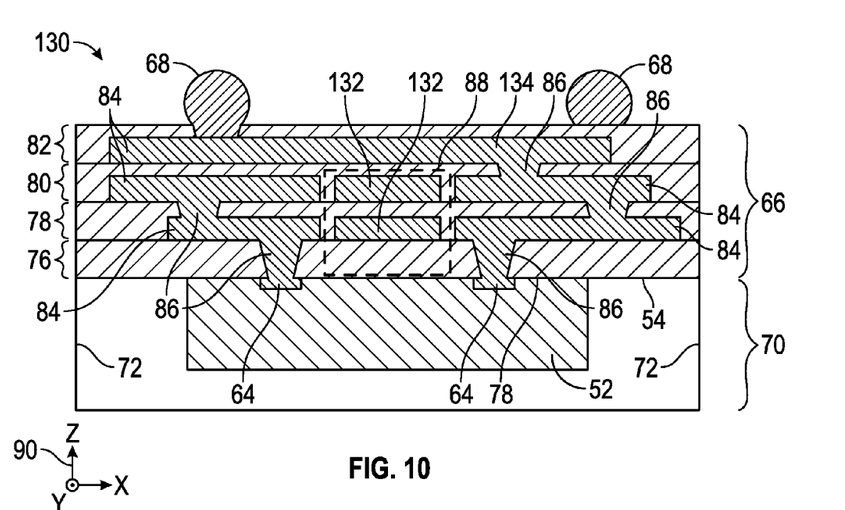
FIGS. 10 and 11 are cross-sectional views illustrating FO-WLPs produced to include metal fill features within the routing-free dielectric blocks located within the redistribution layers, as illustrated in accordance with a still further exemplary embodiment of the present invention.
Figure 11:
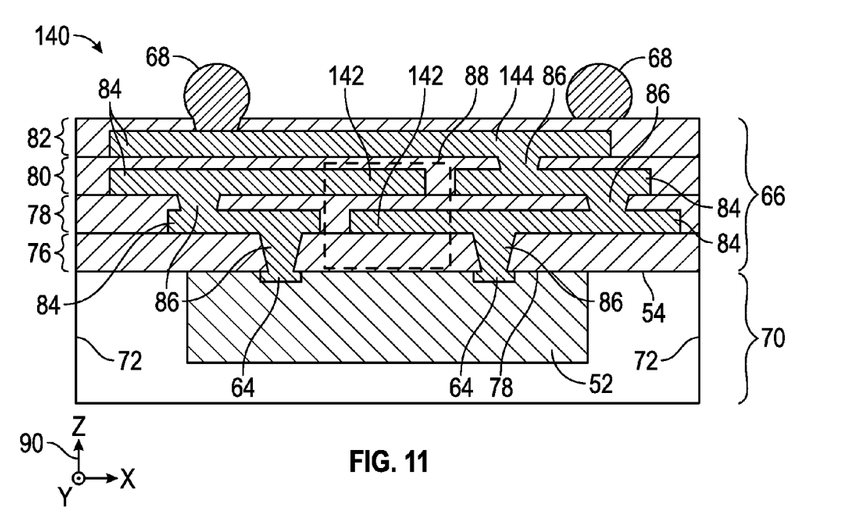

The foregoing has thus provided embodiments of WLPs including metal planes overlying routing-free dielectric blocks within the redistribution layers and patterned to include outgassing openings, which permit the bulk outflow of water vapor during package heating. In further embodiments, the WLPs can be produced to include metal fill features within the routing-free dielectric blocks, which reduce the dielectric content thereof and thus reduce the water-bearing capacity of the routing-free dielectric block. In this case, the metal fill features can comprise patterned portions of the metal levels intersecting the routing-free dielectric blocks, which do not provide a routing functionality. In certain embodiments, the metal fill features assume the form of floating dummy plates, which are electrically isolated from the interconnect lines surrounding the routing-free dielectric block. Consider, for example, FIG. 10 illustrating an exemplary FO-WLP 130 including metal fill features in the form of two dummy plates 132 located within dielectric block 88 (like reference numerals utilized to denote like structural elements). In this case, the upper dummy plate 132 is formed as a patterned portion of the $M_2$ metal level, while the lower dummy plate 132 is formed as a patterned portion of the $M_1$ metal level. As a further example, FIG. 11 illustrates an exemplary FO-WLP 140 including metal fill features in the form of extended metal planes 142 (again, like reference numerals utilized to denote like structural elements). As shown in FIG. 11, extended metal planes 142 project laterally from the interconnect lines 84 surrounding routing-free dielectric block 88 into dielectric block 88. In this case, extended metal planes 142 are electrically-active and formed in ohmic contact with interconnect lines 84; however, extended metal planes 142 are not required or utilized for routing purposes and are consequently not considered routing features in the context of the present document. Accordingly, dielectric block 88 is still considered a "routing-free dielectric block" in the context of the present document.

The metal fill features (e.g., dummy plates 132 in FIG. 10 and extended metal planes 142 in FIG. 11) reduce the dielectric content of routing-free dielectric blocks 88 and, therefore, the moisture-absorbing capacity thereof. As a result, less moisture is available for vaporization within dielectric blocks 88 during package heating; and the internal pressure within dielectric blocks 88 is maintained sufficiently low to prevent delamination of redistribution layers 66. Notably, the metal fill features can make-up a sufficiently large volumetric percentage of dielectric blocks 88 to prevent significant pressure build-up even when routing-free dielectric blocks 88 are capped by a solid metal plane, such a power and/or ground plane. This may be appreciated by again referring to FIGS. 9 and 10, which illustrate blocks 88 as capped by solid metal planes 134 and 144, respectively. However, the possibility that the metal fill features can be utilized in conjunction with outgassing openings in the overlying metal plane(s), is by no means precluded. Generally, it is desirable for the metal fill features to occupy a relatively large volumetric percentage of dielectric blocks 88 to minimize the dielectric content and moisture-absorbing capacity thereof. In this regard, it is generally preferred that the metal fill features constitute at least 25% and, more preferably, at least 50% of the volume of routing-free dielectric blocks 88. This notwithstanding, the metal fill features may constitute less than 25% of the volume of dielectric blocks 88 in certain embodiments. Additionally, various different combinations of outgassing openings and metal fill features (e.g., dummy plates and/or metal plane extensions) can be utilized in further embodiments. Thus, such features are not mutually exclusive in the content of the present document.

There has thus been provided multiple exemplary embodiments of WLPs and methods for producing WLPs including delamination-resistant redistribution layers. While primarily described above in the context of FO-WLPs, it will be appreciated that the above-described methods apply equally to FI-WLPs having redistribution layers. Embodiments of the above-described fabrication process are particularly useful in instances wherein it is desired to produce WLPs having relatively high wiring densities and, therefore, more than two redistribution layers overlying packaged semiconductor die or other microelectronic components. The above-described fabrication processes are especially well-suited for avoiding or reducing the likelihood of the capping effect, which can otherwise occur when routing-free dielectric blocks are located over a packaged semiconductor die and capped by solid metal planes. In certain embodiments, the capping effect can be avoided by identifying the areas of likely delamination (i.e., the routing-free dielectric blocks) and patterning any capping plane or planes to include outgassing openings overlying the routing-free dielectric blocks. As noted above, the outgassing openings can be provided by patterning metal planes formed in a metal level above the routing-free dielectric blocks to include mesh regions, which overly the dielectric blocks. Additionally or alternatively, the routing-free dielectric blocks can be produced to contain metal fill features of the type described above.

In one embodiment, the above-described method includes building inner redistribution layers over a semiconductor die. Inner redistribution layers include a body of dielectric material containing metal routing features. A routing-free dielectric block is formed in the body of dielectric material, overlies the semiconductor die, and is uninterrupted by the metal routing features. An outer redistribution layer is produced over the inner redistribution layers and contains a metal plane, which is patterned to include one or more outgassing openings overlying the routing-free dielectric block. The routing-free dielectric block has a minimum width, length, and depth each at least twice the thickness of the outer redistribution layer. As previously noted, the outer redistribution layer can be any layer formed over the inner redistribution layers such that the outer redistribution layer may or may not be the outermost or final redistribution layer. In other words, it is possible for one or more additional redistribution layers to be formed over the outer redistribution layer. Conversely, the inner redistribution layers can be any set or series of layers formed under the outer redistribution layer such that the inner redistribution need not always be the innermost redistribution layers. In other words, in certain embodiments, one or more redistribution layers can be formed under the inner redistribution layers.

In another embodiment, the above-described method includes building inner redistribution layers over a semiconductor die. Inner redistribution layers include a body of dielectric material containing metal routing features. A routing-free dielectric block is formed in the body of dielectric material, overlies the semiconductor die, and is uninterrupted by the metal routing features. An outer redistribution layer is produced over the inner redistribution layers and contains a metal plane, which overlies or caps the routing-free dielectric block. The routing-free dielectric block has a minimum width, length, and depth each at least twice the thickness of the outer redistribution layer. The inner redistribution layers are built to further include metal fill features located within the routing-free dielectric block.

In a further embodiment, the method includes the step/process of establishing an initial redistribution layer layout comprising multiple patterned metal levels interspersed with multiple dielectric layers. Routing-free dielectric blocks within the initial redistribution layer design that are free of metal routing, that are capped by solid metal planes, and that each have a depth spanning at least two overlying dielectric layers are identified. The initial redistribution layer layout is then modified to increase the metal content within the routing-free dielectric blocks, to provide outgassing openings in the metal planes capping the routing-free dielectric blocks, or a combination thereof. Redistribution layers are then produced over a semiconductor die in accordance with the modified redistribution layer layout.

The foregoing has also provided embodiments of a wafer level package that includes a semiconductor die and a plurality of redistribution layers, which are formed over the semiconductor die. The redistribution layers include a body of dielectric material and metal routing features, which are formed in the body of dielectric material and electrically coupled to the semiconductor die. At least one routing-free dielectric block is also formed in the body of dielectric material, overlying the semiconductor die, and uninterrupted by the metal routing features. A metal plane overlies the routing-free dielectric block. The routing-free dielectric block has a minimum width, length, and depth each at least twice the thickness of each redistribution layer included within the plurality of redistribution layers. Additionally, one or both of the following conditions are met: (i) metal plane is patterned to include one or more outgassing openings overlying the routing-free dielectric block, and/or (ii) the plurality of redistribution layers further comprising metal fill features formed within the routing-free dielectric block.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes can be made in the function and arrangement of elements described in an exemplary embodiment without departing from the scope of the invention as set-forth in the appended claims.

As appearing in the foregoing Detailed Description, terms such as "comprise," "include," "have," and the like are intended to cover non-exclusive inclusions, such that a process, method, article, or apparatus that comprises a list of elements is not necessarily limited to those elements, but can include other elements not expressly listed or inherent to such process, method, article, or apparatus. As still further appearing herein, terms such as "over," "under," "on," and the like are utilized to indicate relative position between two structural elements or layers and not necessarily to denote physical contact between structural elements or layers. Thus, a first structure or layer can be described as fabricated "over" or "on" a second structure, layer, or substrate without indicating that the first structure or layer necessarily contacts the second structure, layer, or substrate due to, for example, presence of one or more intervening layers. As appearing further herein, the term "microelectronic component" is utilized in a broad sense to refer to an electronic device, element, or structure produced on a relatively small scale and amenable to packaging in the below-described manner. Microelectronic components include, but are not limited to, integrated circuits formed on semiconductor die, Microelectromechanical Systems (MEMS) devices, passive electronic components, optical devices, and other small scale electronic devices capable of providing processing, memory, sensing, radiofrequency, optical, and actuator functionalities, to list but a few examples. Microelectronic components also include other discrete or separately-fabricated structures that can be integrated into the FO-WLP, such as prefabricated via structures and prefabricated antenna structures.

What is claimed is:

1. A method for producing a wafer level package, the method comprising:
   embedding a semiconductor die in a molded panel having a frontside surface at which the semiconductor die is exposed;
   forming inner redistribution layers over a semiconductor die by depositing a body of dielectric material over the frontside surface of the molded panel and producing metal routing features in the body of dielectric material electrically coupled to the semiconductor die, the inner redistribution layers formed to include a routing-free dielectric block in the body of dielectric material and uninterrupted by the metal routing features; and
   forming an outer redistribution layer over the inner redistribution layers, the outer redistribution layer containing a metal plane patterned to include one or more outgassing openings overlying the routing-free dielectric block;
   wherein the routing-free dielectric block has a minimum width, length, and depth each at least twice the thickness of the outer redistribution layer;
   wherein the routing-free dielectric block is located between the semiconductor die and the outgassing openings formed in the metal plane, as taken along an axis orthogonal to the outer redistribution layer; and
   wherein the routing-free dielectric block is formed to include a first boundary adjacent the outgassing openings and a second, opposing boundary adjacent a frontside of the semiconductor die.

2. The method of claim 1 wherein forming an outer redistribution layer comprises patterning the metal plane to include one or more outgassing openings having a cumulative surface area that is at least 50% the planform surface area of the routing-free dielectric block.

3. The method of claim 1 wherein forming an outer redistribution layer comprises producing the outer redistribution layer as a final redistribution layer included within the wafer level package.

4. The method of claim 1 wherein the forming an outer redistribution layer comprises producing the metal plane to comprise one of the group consisting of a ground and a power plane.

5. The method of claim 1 wherein forming the outer redistribution layer comprises patterning the metal plane to include a mesh region overlying the routing-free dielectric block.

6. The method of claim 1 wherein forming inner redistribution layers comprises forming the inner redistribution layers to include a plurality of routing-free dielectric blocks overlying the semiconductor die, and wherein forming the outer redistribution layer comprises producing the metal plane to include a mesh region extending over the plurality of routing-free dielectric blocks.

7. The method of claim 1 wherein forming inner redistribution layers comprises forming the routing-free dielectric block to contain less than 10% metal, by volume.

8. The method of claim 1 wherein forming inner redistribution layers comprises forming the routing-free dielectric block to have a depth spanning at least three redistribution layers.

9. The method of claim 1 wherein the metal routing features are produced to surround the routing-free dielectric block.

10. A method for producing a wafer level package, the method comprising:

embedding a semiconductor die in a molded panel having a frontside surface at which the semiconductor die is exposed;

forming inner redistribution layers over the frontside surface of the molded panel and the semiconductor die, the inner redistribution layers comprising:
- a routing-free dielectric block formed in a body of dielectric material and uninterrupted by metal routing features; and
- dummy plates located within the routing-free dielectric block and electrically isolated from the metal routing features;

producing an outer redistribution layer over the inner redistribution layers, the outer redistribution layer containing a metal plane overlying the routing-free dielectric block;

wherein the routing-free dielectric block has a minimum width, length, and depth each at least twice the thickness of the outer redistribution layer;

wherein the routing-free dielectric block is located between the semiconductor die and the outgassing openings formed in the metal plane, as taken along an axis orthogonal to the outer redistribution layer; and wherein the routing-free dielectric block is formed to include a first boundary adjacent the outgassing openings and a second, opposing boundary adjacent a frontside of the semiconductor die.

11. The method of claim 10 wherein producing comprises producing the metal plane to include a solid region covering the routing-free dielectric block.

12. The method of claim 11 wherein producing comprises producing the metal plane to comprise one of the group consisting of a ground plane and a power plane.

13. The method of claim 10 wherein forming comprises forming the dummy plates to constitute at least 50% of the total volume of each routing-free dielectric block.

14. The method of claim 10 wherein forming comprises forming the routing-free dielectric block to have a depth spanning at least three redistribution layers.

15. A method for producing a wafer level package, the method comprising:

embedding a semiconductor die in a molded panel having a frontside surface at which the semiconductor die is exposed;

building-up inner redistribution layers over the semiconductor die by depositing a body of dielectric material over the frontside surface of the molded panel and by producing metal routing features in the body of dielectric material electrically coupled to the semiconductor die, the inner redistribution layers comprising:
- a routing-free dielectric block in the body of dielectric material and uninterrupted by the metal routing features; and
- metal fill features integrally formed with and extending from selected ones of the metal routing features into the routing-free dielectric block;

forming an outer redistribution layer over the inner redistribution layers, the outer redistribution layer containing a metal plane overlying the routing-free dielectric block;

wherein the routing-free dielectric block has a minimum width, length, and depth each at least twice the thickness of the outer redistribution layer;

wherein the routing-free dielectric block is located between the semiconductor die and the outgassing openings formed in the metal plane, as taken along an axis orthogonal to the outer redistribution layer; and wherein the routing-free dielectric block is formed to include a first boundary adjacent the outgassing openings and a second, opposing boundary adjacent a frontside of the semiconductor die.

16. The method of claim 15 wherein the outer redistribution layer is produced such that the metal plane includes a solid region capping the routing-free dielectric block.

\* \* \* \* \*